(12) United States Patent
Zhu

(10) Patent No.: US 8,013,670 B2
(45) Date of Patent: Sep. 6, 2011

(54) METHOD, APPARATUS, AND SYSTEM FOR OBTAINING TUNING CAPACITANCE FOR GM-C FILTER

(75) Inventor: Xiaosheng Zhu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/882,734

(22) Filed: Sep. 15, 2010

(65) Prior Publication Data

US 2011/0050333 A1    Mar. 3, 2011

Related U.S. Application Data

(63) Continuation of application No. PCT/CN2009/072224, filed on Jun. 11, 2009.

(30) Foreign Application Priority Data

Jun. 16, 2008  (CN) .......................... 2008 1 0028801

(51) Int. Cl.
  *H03B 1/00*    (2006.01)
(52) U.S. Cl. ....................................... 327/554
(58) Field of Classification Search .................. 327/336, 327/337, 551, 552, 553, 554
  See application file for complete search history.

(56) References Cited

U.S. PATENT DOCUMENTS

| | | | |
|---|---|---|---|
| 6,400,932 B1 * | 6/2002 | Oh et al. ..................... | 455/150.1 |
| 6,404,277 B1 * | 6/2002 | Lee et al. ...................... | 327/553 |
| 6,483,380 B1 | 11/2002 | Molnar et al. | |
| 6,791,400 B2 * | 9/2004 | Lou ............................... | 327/554 |
| 6,903,602 B2 * | 6/2005 | Cusinato ...................... | 327/552 |
| 7,113,029 B2 * | 9/2006 | Hsieh et al. .................. | 327/553 |
| 7,239,197 B2 * | 7/2007 | Chen et al. .................... | 327/553 |
| 2006/0034621 A1 | 2/2006 | Denoyer | |

FOREIGN PATENT DOCUMENTS

| | | |
|---|---|---|
| CN | 1468466 | 1/2004 |
| CN | 1977473 | 6/2007 |
| CN | 101299599 | 11/2008 |

OTHER PUBLICATIONS

International Search Report for PCT/CN2009/072224, mailed Sep. 24, 2009.

* cited by examiner

*Primary Examiner* — Jeffrey S Zweizig
(74) *Attorney, Agent, or Firm* — Staas & Halsey LLP

(57) ABSTRACT

The present invention discloses a method, apparatus and system for obtaining the tuning capacitance of a Gm-C filter. The method includes: integrating a simulated capacitor within a given time via a current, where the simulated capacitor simulates the capacitor of the Gm-C filter which is set to an even capacitor array; and comparing the integral voltage obtained by the integration with the reference voltage, finding a simulated capacitance that makes the integral voltage equal to the reference voltage via gradual approaching by adjusting a control code, and determining the simulated capacitance as the tuning capacitance. The present invention improves the performance of a Gm-C filter without affecting the performance of the Gm-C filter.

20 Claims, 17 Drawing Sheets

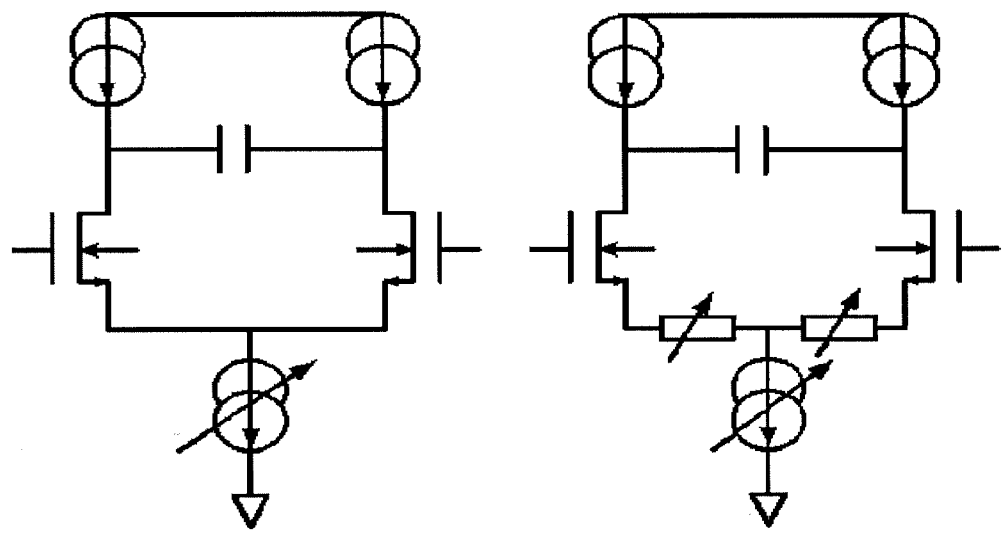
FIG. 1 (PRIOR)
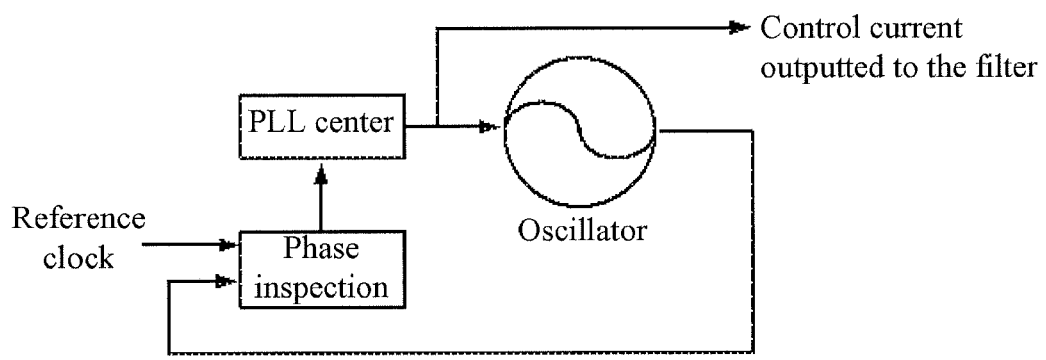
FIG. 2 (PRIOR)

US 8,013,670 B2

METHOD, APPARATUS, AND SYSTEM FOR OBTAINING TUNING CAPACITANCE FOR GM-C FILTER

CROSS-REFERENCE TO RELATED APPLICATIONS

This application is a continuation of International Application No. PCT/CN2009/072224, filed on Jun. 11, 2009, which claims priority to Chinese Patent Application No. 200810028801.3, filed on Jun. 16, 2008, both of which are hereby incorporated by reference in their entireties.

FIELD OF THE INVENTION

The present invention relates to mobile communication technologies, and in particular, to a method, apparatus, and system for obtaining the tuning capacitance of a Gm-C filter.

BACKGROUND OF THE INVENTION

The Gm-C filter is a common filter structure with low power consumption and high bandwidth and is applicable to various wired and wireless technology fields.

The most obvious weakness of an on-chip integrated filter is the strong process dependency between the integrated capacitance and resistance. This always results in a large offset of the cut-off frequency of the filter from the designed value and affects the filter performance. Therefore, as the on-chip integrated filter is put in use, a tuning circuit is necessary for the filter. In a Gm-C filter structure, for tuning of the filter frequency (the quality factor Q of the filter also needs to be tuned in some occasions), Gm tuning is generally adopted.

Because the cut-off frequency of a filter is in direct proportion to Gm/C, filter frequency tuning is always implemented by changing the Gm value. FIG. 1 shows the structures of two common Gm units, MOS input (or diode input) and degradation resistance input. An obvious characteristic of the two Gm units is that the Gm value is not in absolute proportion to the current intensity or resistance and therefore it is hard to control the cut-off frequency of the filter through discrete currents. As a result, tuning based on a digital Phase-Locked Loop (PLL) structure is popular.

FIG. 2 shows a filter frequency tuning process using a PLL to regulate the tail current. A PLL is integrated on the chip and the PLL utilizes a Voltage Control Oscillator (VCO) made up of Gm-C units that have the same structure as the filter to implement frequency control. The PLL decides the frequency control of the VCO by regulating the tail current of the VCO.

During the implementation of the present invention, the inventor finds that the filter frequency tuning solution in the prior art has the following weakness:

The frequency tuning is implemented via the change of the tail current of the VCO. As a result, the linearity of the filter changes with the tail current of the VCO and thus the performance of the Gm-C filter is affected.

SUMMARY OF THE INVENTION

Embodiments of the present invention provide a method, apparatus and system for obtaining the tuning capacitance of a Gm-C filter so as to improve the precision of Gm-C filter tuning without affecting performance of the Gm-C filter.

The purpose of embodiments of the present invention is realized through the following technical solution:

A method for obtaining the tuning capacitance of a Gm-C filter includes:

generating a current for charging an integrator of the Gm-C filter;

integrating a simulated capacitor of the Gm-C filter within a given time when the integrator is charged wherein the simulated capacitor simulates the capacitor of the Gm-C filter which is set to a capacitor array; and comparing the integral voltage obtained by integrating the simulated capacitor with a preset reference voltage, finding a simulated capacitance of the simulated capacitor that makes the integral voltage equal to the reference voltage via gradual approaching by adjusting a control code, and determining the simulated capacitance as the tuning capacitance.

An apparatus for obtaining the tuning capacitance of a Gm-C filter includes:

a current supply unit, adapted to generate a current to charge an integrator unit;

the integrator unit, adapted to integrate a simulated capacitor within a given time when it is charged, wherein the simulated capacitor simulates the capacitor of the Gm-C filter which is set to a capacitor array in advance;

a comparator unit, adapted to compare the integral voltage obtained by integrating the simulated capacitor with a preset reference voltage; and a controller unit, adapted to find a simulated capacitance of the simulated capacitor that makes the integral voltage equal to the reference voltage via gradual approaching by adjusting a control code and determining the simulated capacitance as the tuning capacitance.

A Gm-C filter tuning system includes:

an apparatus for obtaining the tuning capacitance of a Gm-C filter, adapted to integrate a simulated capacitor which simulates the capacitor of the Gm-C filter that is set to a capacitor array to obtain an integral voltage, find a simulated capacitance that makes the integral voltage equal to a preset reference voltage via gradual approaching by adjusting a control code, regard the simulated capacitance as the tuning capacitance, store a control code associated with the tuning capacitance, and provide the control code for the Gm-C filter to tune the capacitance of the Gm-C filter; and the Gm-C filter, the capacitor of whose Gm unit is tuned to the tuning capacitance associated with the control code provided by the apparatus for obtaining the tuning capacitance of the Gm-C filter.

The tuning provided in the embodiments of the present invention is linear discrete. Therefore, the linearity of the Gm-C filter will not change with the tail current of a VCO. Thus, the precision of Gm-C filter tuning is improved without affecting performance of the Gm-C filter.

BRIEF DESCRIPTION OF THE DRAWINGS

FIG. 1 shows the structures of two primary Gm units in a prior art;

FIG. 2 shows a filter frequency tuning process by regulating the tail current using a PLL in the prior art;

DETAILED DESCRIPTION OF THE EMBODIMENTS

The following describes the embodiments of the present invention in detail with reference to the accompanying drawings.

An embodiment of the present invention provides a method and apparatus for obtaining a tuning capacitance so as to improve the precision of Gm-C filter tuning without affecting performance of the Gm-C filter.

Figure 3:
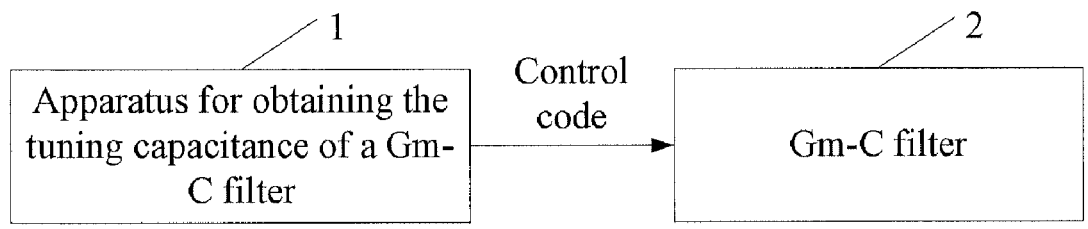
FIG. 3 shows the composition of a Gm-C filter tuning system provided in an embodiment of the present invention.

FIG. 3 shows the composition of a Gm-C filter tuning system provided in an embodiment of the present invention.

As shown in FIG. 3, the filter tuning system includes an apparatus 1 for obtaining the tuning capacitance of a Gm-C filter, and a Gm-C filter 2.

The apparatus 1 is adapted to: obtain an integral voltage by integrating a simulated capacitor, find a tuning capacitance that makes the integral voltage equal to a reference voltage via gradual approaching by adjusting the control code, and tune the capacitance of the Gm-C filter according to the control code in association with the tuning capacitance, where the simulated capacitor simulates the capacitor of the Gm-C filter 2 that is set to an even capacitor array.

The capacitor of the Gm unit in the Gm-C filter 2 is tuned to the tuning capacitance in association with the control code provided by the apparatus 1. The capacitor of the Gm-C filter 2 is set to an even capacitor array in advance.

The tuning between the apparatus 1 and the Gm-C filter 2 is in master/slave mode using a linear discrete capacitance approaching method. Thus, performance of the Gm-C filter will not be affected because the linearity of the Gm-C filter does not change with the tail current during the tuning process and finally the tuning of the Gm-C filter is more precise.

Figure 4:
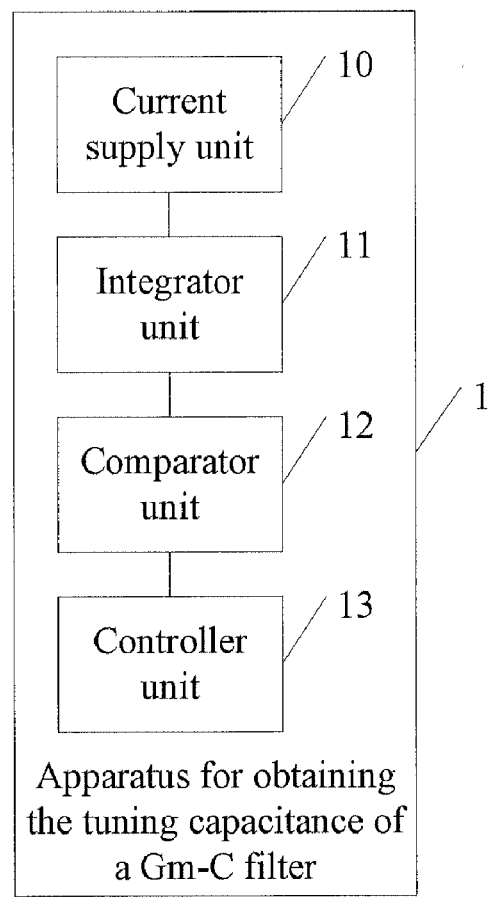
FIG. 4 shows the structure of an apparatus for obtaining the tuning capacitance of a Gm-C filter in a first embodiment of the present invention.

FIG. 4 shows the structure of an apparatus for obtaining the tuning capacitance of a Gm-C filter in a first embodiment of the present invention.

The apparatus shown in FIG. 4 includes:
a current supply unit 10, adapted to generate a current to charge an integrator unit 11;
the integrator unit 11, adapted to integrate a simulated capacitor within a given time when it is charged, where the simulated capacitor simulates the capacitor of the Gm-C filter which is set to an even capacitor array in advance;
a comparator unit 12, adapted to compare the integral voltage obtained by integrating the simulated capacitor with a reference voltage; and
a controller unit 13, adapted to find a simulated capacitance that makes the integral voltage equal to the reference voltage as the tuning voltage via gradual approaching by adjusting the control code.

The current supplying unit 10 may be a Gm unit which simulates the structure of the Gm unit in the tuned Gm-C filter; the current supplying unit 10 may also be a differential current source. In the following embodiments, the current supply unit is respectively a Gm unit and a differential current source.

Figure 5:
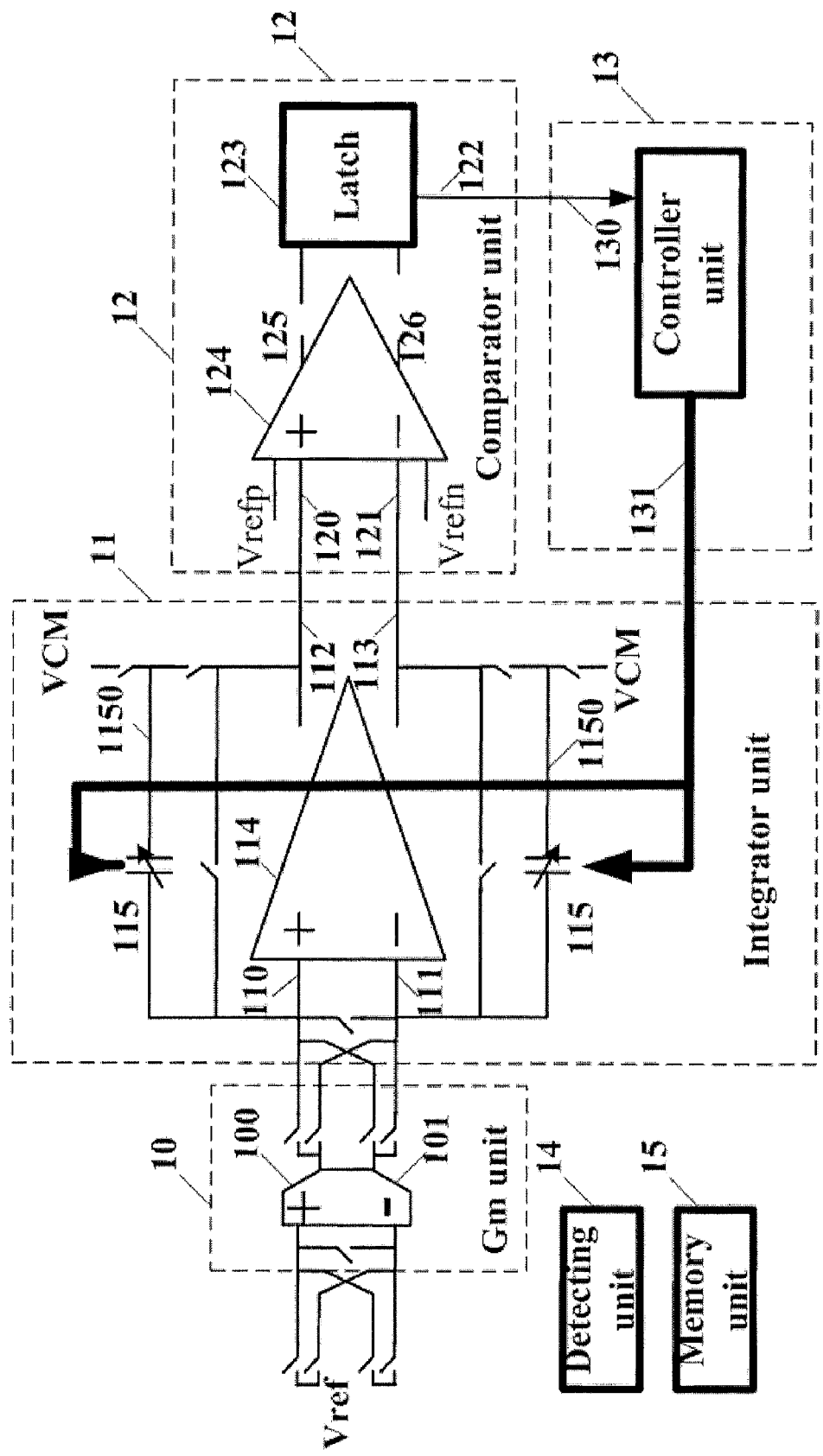
FIG. 5 shows the structure of an apparatus for obtaining the tuning capacitance of a Gm-C filter in a second embodiment of the present invention.

FIG. 5 shows the structure of an apparatus for obtaining the tuning capacitance of a Gm-C filter in a second embodiment of the present invention.

In the apparatus for obtaining the tuning capacitance of a Gm-C filter shown in FIG. 5, the current supply unit is a Gm unit 10 which simulates the Gm unit with the same structure as the tuned Gm-C filter and a simulated capacitor 15 in the integrator unit 11 simulates the capacitor of the Gm-C filter that is preset to an even capacitor array, so as to avoid the impact of linearity of the Gm unit of the Gm-C filter on the tuning precision.

It should be noted that the first thing to do for tuning the cut-off frequency of the Gm-C filter is to set the capacitor of the Gm-C filter to some small even capacitor arrays. Assume that 2pF represents the sum of 20*100fF capacitances. According to the frequency offset caused by the engineering process, the capacitor is set to a combination of two parts, fixed capacitor and tuning capacitor. Then, the capacitance of the capacitor array is $C=C_{fix}+C_{tuning}$, where $C_{fix}$ is a fixed number of unit capacitors and $C_{tuning}$ is a configurable number of unit capacitors. The tuning frequency is decided by a ratio of $C_{fix}$ to $C_{tuning}$.

Then the variable capacitor 15 in the integrator unit 11 simulates the capacitor array of the Gm-C filter and the integrator unit 11 integrates the variable capacitor 115 within a given time with the current generated by the Gm unit 10. The integral voltage thus obtained is compared with a reference voltage until an optimal simulated capacitance of the simulated capacitor 115 (variable capacitor) is found so that the integral voltage equals the reference voltage. The optimal simulated capacitance is the tuning capacitance. In particular, the apparatus for obtaining the tuning capacitance of the Gm-C filter shown in FIG. 5 includes a Gm unit 10 and an integrator unit 11.

The positive output 100 of the Gm unit 10 is connected to the positive input 100 of the integrator unit 11 and the negative output 101 of the Gm unit 10 is connected to the negative input 111 of the integrator unit 11 to generate a current to charge the integrator unit 11.

The positive input 110 of the integrator unit 11 is connected to the positive output 100 of the Gm unit 10 and the negative input 111 of the integrator unit 11 is connected to the negative output 101 of the Gm unit 10; or the positive input 110 of the integrator unit 11 is connected to the negative output 101 of the Gm unit 10 and the negative input 111 of the integrator unit 11 is connected to the positive output 100 of the Gm unit 10.

An output 112 of the integrator unit 11 is connected to the positive input 120 of a comparator unit 12 and another output 113 of the integrator unit 11 is connected to the negative input 121 of the comparator unit 12. The input 110 and input 111 are also respectively connected to the variable capacitor 115. The output 1150 of the variable capacitor 115 is connected to a common-mode reference level VCM. Within the given time, an operation amplifier 114 integrates the variable capacitor 115 according to a control code of the controller unit 13 to obtain an integral voltage.

The apparatus shown in FIG. 5 further includes the comparator unit 12.

The comparator unit 12 includes a comparator 123 and a voltage amplifier 124. Its anode input 120 is connected to the output 112 of the integrator unit 12 and its cathode input 121 is connected to the output 113 of the integrator unit 11. The output 125 and the output 126 of the comparator unit 12 are connected to the comparator 123. The voltage amplifier 124 amplifies and subtracts the voltage via a two-phase switched capacitor. The comparator 123 compares the integral voltage obtained by the integrator unit 11 with the reference voltage. The output 122 of the comparator unit 12 is connected to the input 130 of the controller unit 13 to send the comparison result to the controller unit 13.

The apparatus shown in FIG. 5 further includes the controller unit 13.

The controller unit is adapted to send the control code to the integrator unit 11 via its output 131 to control the integrator unit 11 to integrate the variable capacitor 115. The controller unit also adjusts the control code according to the comparison result of the comparator unit 12 gradually to find a capacitance that makes the integral voltage equal to the reference voltage and regard the capacitance as the tuning capacitance. In the embodiment of the present invention, the control code outputted by the controller unit 13 may be an N-bit binary control code. The tuning range is between 0 and ($2^N-1$) corresponding to the number of the unit capacitors $C_{tuning}$, where N is a natural number. For example, the control code is a 5-bit binary control code and the tuning range is (0-31) configurable unit capacitors $C_{tuning}$.

Figure 6:
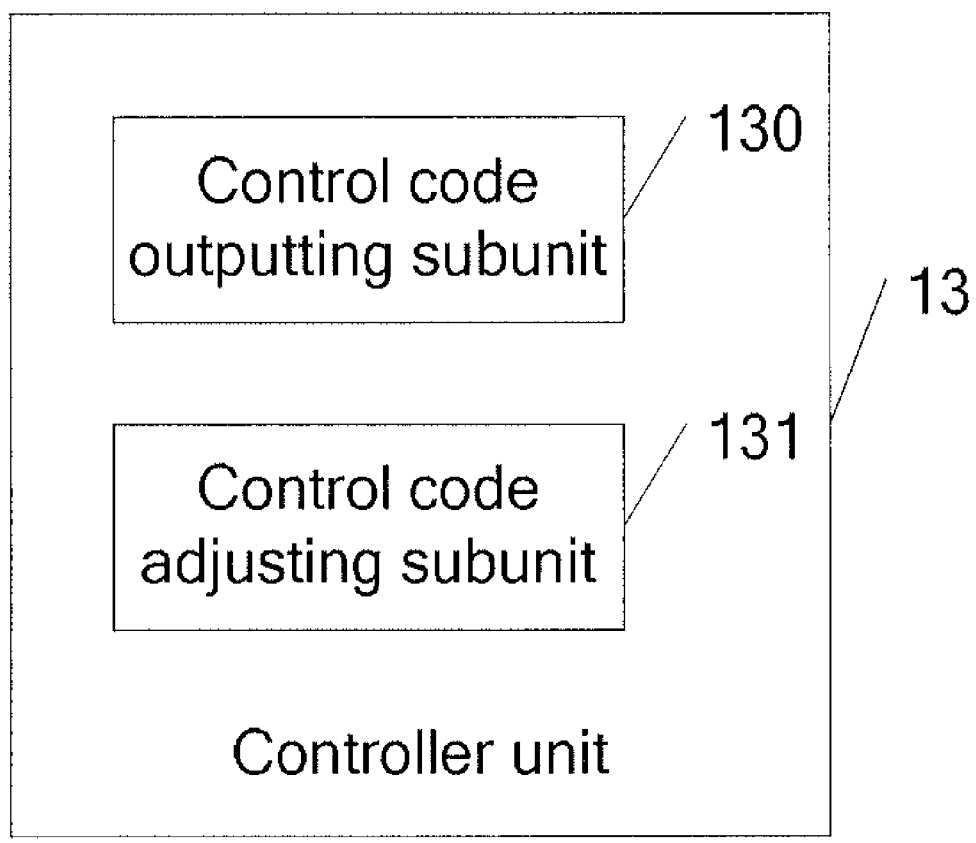
FIG. 6 shows the structure of a controller unit in the apparatus for obtaining the tuning capacitance of a Gm-C filter in an embodiment of the present invention.

As shown in FIG. 6, the controller unit 13 includes:
a control code outputting subunit 130, adapted to output an N-bit binary control code to the integrator unit 11, where N is a natural number; and
a control code adjusting subunit 131, adapted to change the binary control code gradually to find a simulated capacitance that makes the integral voltage equal to the reference voltage as the tuning capacitance.

Particularly, the Gm unit 10 charges the integrator unit 11 and the integrator unit 11 obtains an integral voltage $$V_{out} = \frac{G_m \times V_{ref} \times \Delta t}{C_{int}},$$

wherein $G_m$ is a Gm value of the Gm-C filter, $V_{ref}$ is the preset reference voltage, $\Delta t$ is the given time of integration, and $C_{int}$ is the actually used tuning capacitance which is controlled by the binary control code outputted by the control code outputting subunit 130 of the controller unit 13. After the integrator unit 11 obtains an integral voltage $V_{out}$, the comparator unit 12 compares the $V_{out}$ with $V_{ref}$ and judges whether Gm/C equals 1 until the comparator unit 12 finds the integral voltage $V_{out}$ equals $V_{ref}$, that is, Gm/C equals 1, under the control of the controller unit 13. The $G_{int}$ thus determined is the tuning capacitance.

Particularly, the controller unit 13 controls the capacitance via an N-bit binary control code as follows:

The control code adjusting subunit 131 of the controller unit 13 adjusts the binary control code so that the initial simulated capacitance of the simulated capacitor integrated by the integrator unit 11 is $$C = C_{fix} + \frac{2^{N-1}}{2^N - 1} C_{tuning}.$$

The initial simulated capacitance $$C = C_{fix} + \frac{2^{N-1}}{2^N - 1} C_{tuning}$$

is integrated to obtain an integral voltage. If the integral voltage is above the reference voltage, the controller adjusting subunit 131 changes the binary control code so that the simulated capacitance is $$C = C_{fix} + \frac{2^{N-1} + 2^{N-2}}{2^N - 1} C_{tuning}.$$

If the integral voltage is below the reference voltage, the controller adjusting subunit 131 changes the binary control code so that the simulated capacitance is $$C = C_{fix} + \frac{2^{N-1} - 2^{N-2}}{2^N - 1} C_{tuning}.$$

The step is repeated so that the simulated capacitance that makes the integral voltage $V_{out}$ equal to the reference voltage $V_{ref}$ is gradually approached by changing the binary control code. The simulated capacitance is the tuning capacitance.

The apparatus shown in FIG. 5 further includes:
a detecting unit 14, adapted to start the search for the tuning capacitance when detecting a valid tuning control signal; and
a memory unit 15, adapted to store the control code in association with the tuning capacitance at the end of the tuning and provide the control code for the Gm-C filter to tune the capacitance of the Gm-C filter.

Figure 7:
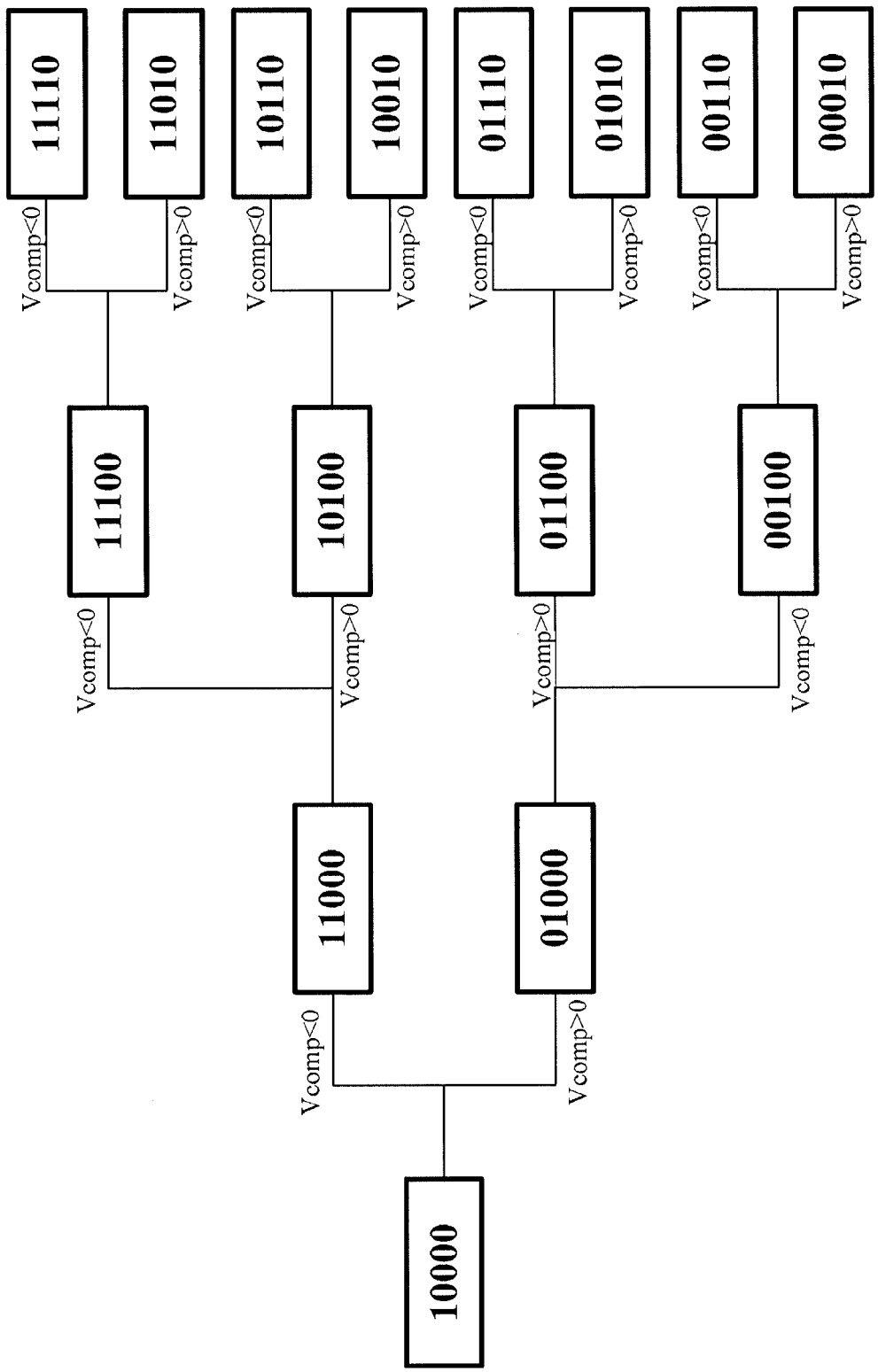
FIG. 7 shows a tuning process controlled by a 5-bit binary control code.

FIG. 7 shows a tuning process controlled by a 5-bit binary control code.

The controller unit 13 first sets the 5-bit binary control code automatically to 10000. Then the corresponding initial simulated capacitance of the simulated capacitor integrated by the integrator unit is:

$$C = C_{fix} + \frac{16}{31}C_{tuning}$$

The initial simulated capacitance $$C = C_{fix} + \frac{16}{31}C_{tuning}$$

is integrated using the formula $$V_{out} = \frac{G_m \times V_{ref} \times \Delta t}{C_{int}}$$

to obtain an integral voltage. If the integral voltage $V_{out}$ is above the reference voltage $V_{ref}$, the controller unit 13 changes the binary control code to 11000 so that the simulated capacitance is $$C = C_{fix} + \frac{24}{31}C_{tuning}.$$

If the integral voltage is below the reference voltage, the controller unit 13 changes the binary control code to 01000 so that the simulated capacitance is $$C = C_{fix} + \frac{8}{31}C_{tuning}.$$

The step is repeated so that the simulated capacitance that makes the integral voltage $V_{out}$ equal to the reference voltage $V_{ref}$ is gradually approached by changing the binary control code. The simulated capacitance is the tuning capacitance. The finally determined binary control code is provided for the Gm-C filter.

Because the input offset of the Gm unit 10 and the operation amplifier unit 114 (Op-amp) in the integrator unit 11, especially the Gm unit 10, will affect the tuning precision, in the integration process, the Gm unit 10 needs to work in a high linearity area. Therefore, the input reference voltage of the Gm unit 10 cannot be high, usually tens to hundreds of millivolts. A DC offset of 10 or more millivolts will have a significant impact on the current outputted by the Gm unit 10 and eventually affect the final output of the integrator unit 11.

Figure 8:
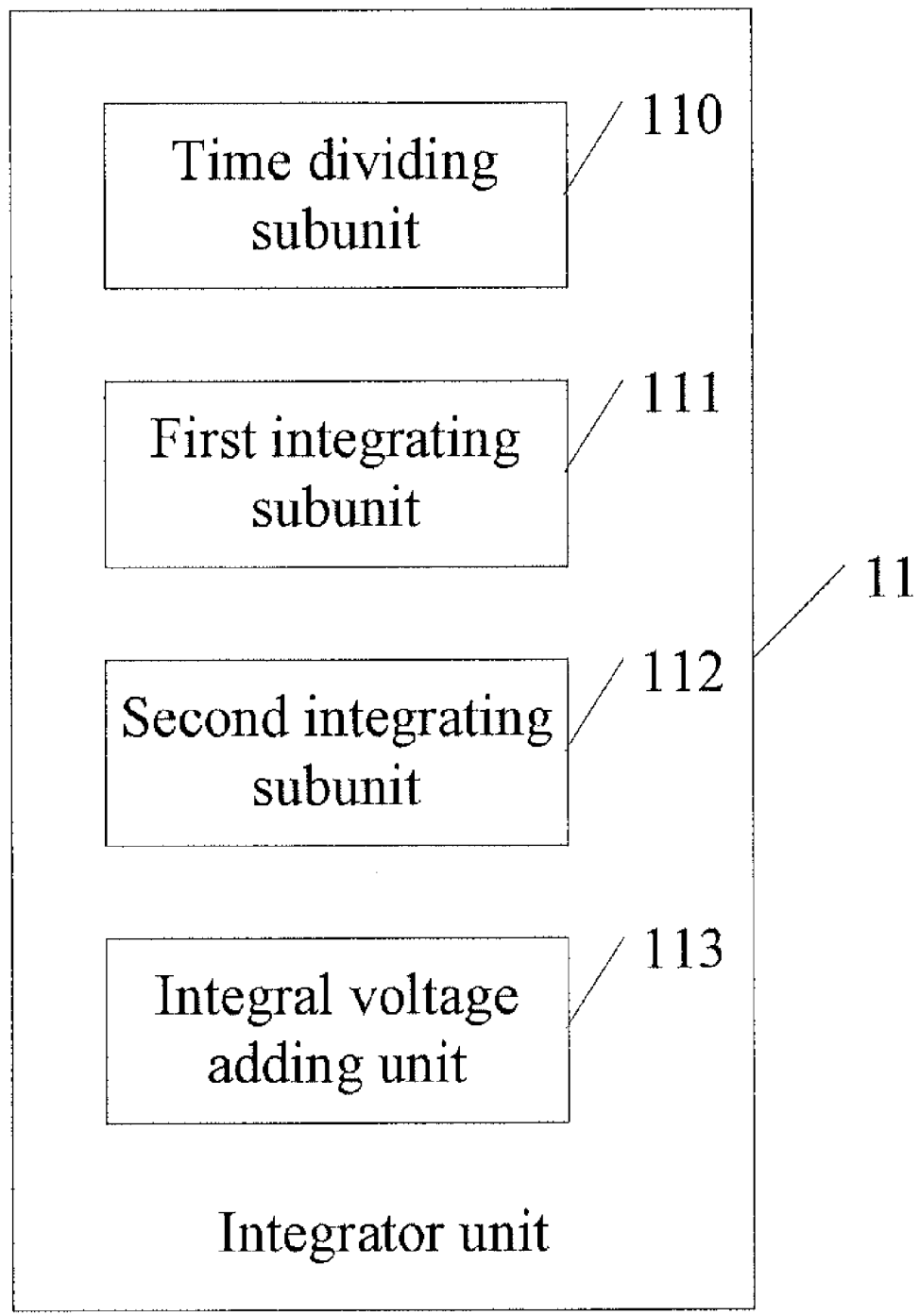
FIG. 8 shows the structure of an integrator unit in the apparatus for obtaining the tuning capacitance of a Gm-C filter in an embodiment of the present invention.

To solve the above problem, an integrator unit 11 provided in an embodiment of the present invention as shown in FIG. 8 includes:

a time dividing subunit 110, adapted to divide the integration time $\Delta t$ into two equal periods of $$\frac{\Delta t}{2};$$

a first integrating subunit 111, adapted to perform positive integration on the simulated capacitor within the first $$\frac{\Delta t}{2}$$

to obtain a first integral voltage;

a second integrating subunit 112, adapted to perform negative integration on the simulated capacitor within the second $$\frac{\Delta t}{2}$$

to obtain a second integral voltage; and an integral voltage adding unit 113, adapted to add the first integral voltage and the second integral voltage to obtain a final integral voltage so as to eliminate the DC offset caused by the Gm unit or differential current source.

Figure 9A:
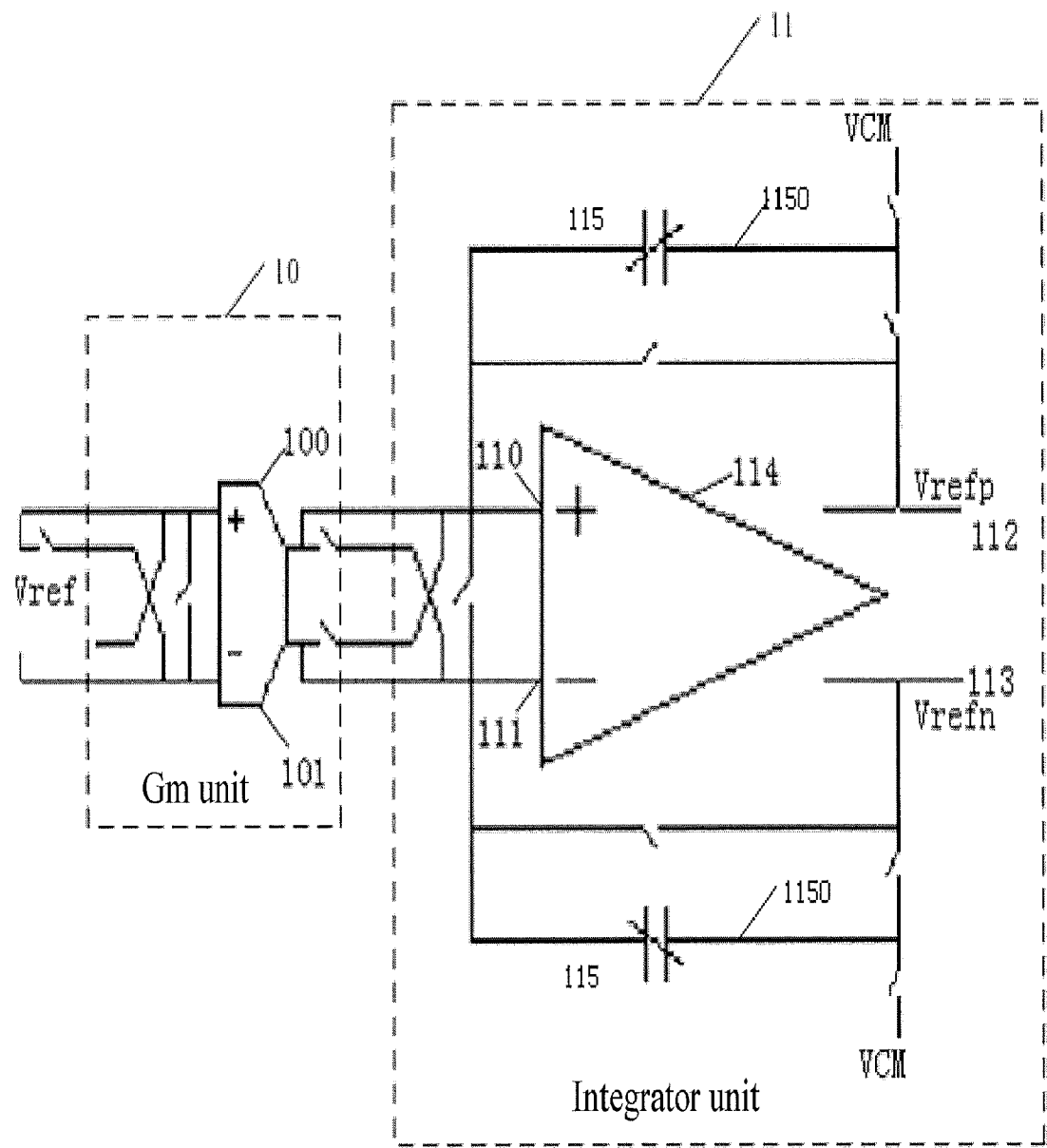
FIGS. 9(a) and 9(b) show the working principle of the integrator unit provided by an embodiment of the present invention.
Figure 9B:
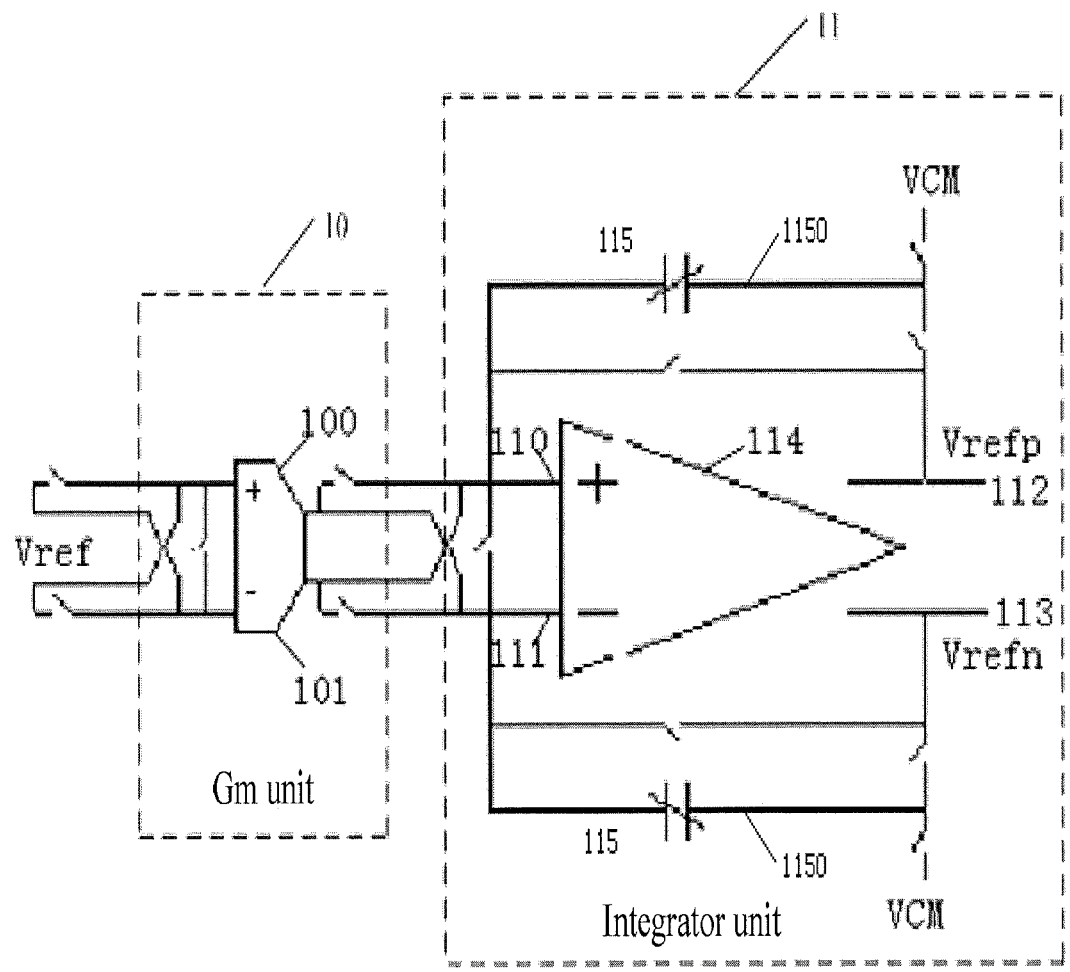

FIGS. 9(*a*) and 9(*b*) show the working principle of the integrator unit 11. The time dividing subunit 110 divides the time $\Delta t$ used by the integrator unit 11 to integrate the capacitor array into two equal periods of $$\frac{\Delta t}{2}.$$

The first integrating subunit 111 performs positive integration on the simulated capacitor within the first $$\frac{\Delta t}{2}.$$

In particular, as shown in FIG. 9(*a*), a positive reference voltage $V_{ref}$ is first inputted to the Gm unit 10 and the positive output 100 of the Gm unit 10 is connected to the positive input 110 of the integrator unit 11 and the negative output 101 of the Gm unit 10 is connected to the negative input 111 of the integrator unit 11 to obtain the first integral voltage.

The second integrating subunit 112 performs negative integration on the simulated capacitor within the second $$\frac{\Delta t}{2}.$$

In particular, as shown in FIG. 9(*b*), a negative reference voltage $V_{ref}$ is inputted to the Gm unit 10 and the positive output 100 of the Gm unit 10 is connected to the negative input 111 of the integrator unit 11 and the negative output 101 of the Gm unit 10 is connected to the positive input 110 of the integrator unit 11 to obtain the second integral voltage.

The integral voltage adding unit 113 adds the first integral voltage and the second integral voltage to eliminate the DC offset caused by the Gm unit 10.

An embodiment of the present invention provides an automatic zero-set technology to eliminate the input DC offset existing in the Op-amp 114 in the integrator unit 11.

Figure 10:
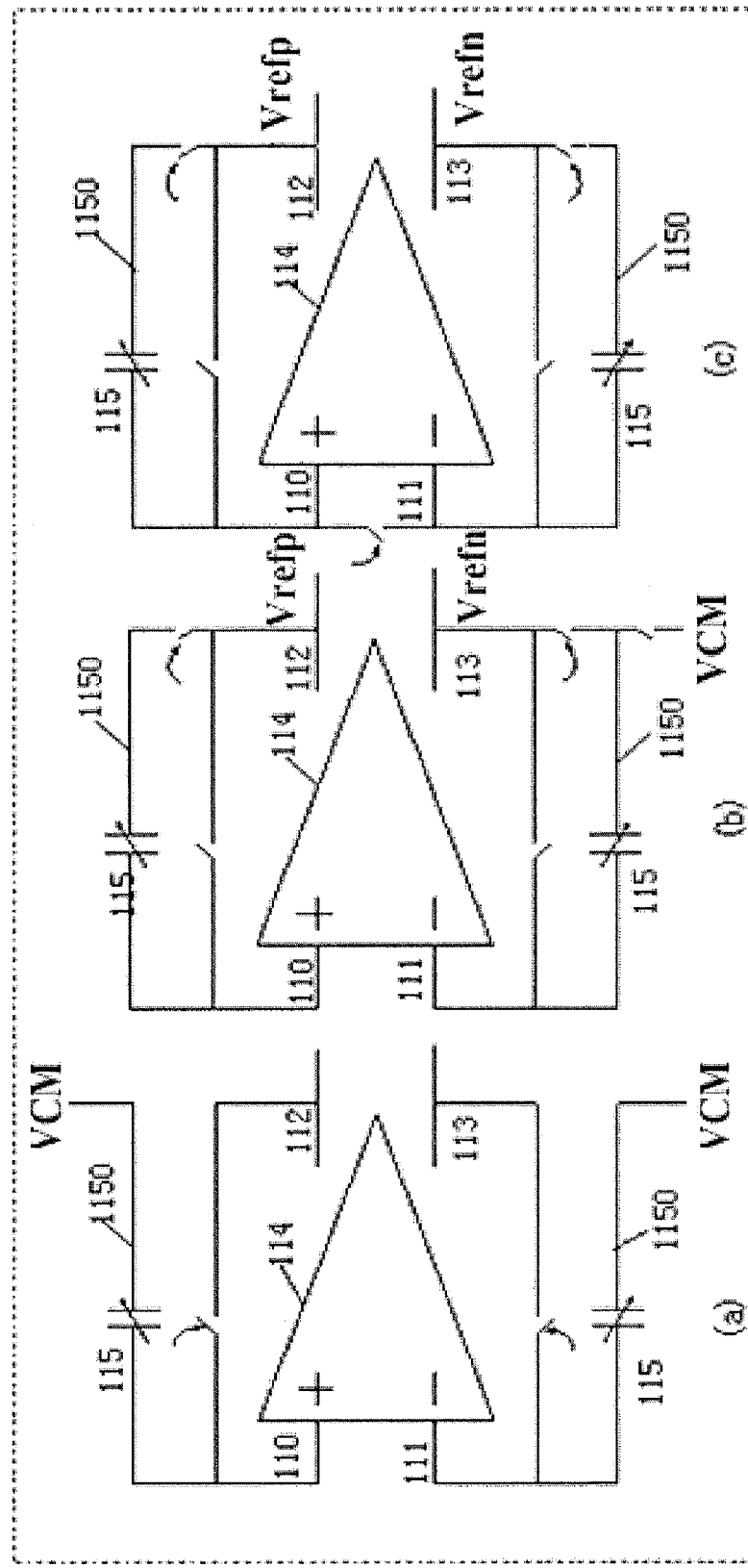
FIG. 10 shows the automatic zero-set of the integrator unit provided by an embodiment of the present invention.

As shown in FIG. 10, the offset of the Op-amp 114 is eliminated through a discharge cycle (a), a self tuning cycle (b), and an output cycle (c) so that the finally outputted integral voltage $$V_{out} = \frac{G_m \times V_{ref} \times \Delta t}{C_{int}}$$

depends on only the $G_m$, $C_{int}$ and $\Delta t$.

In the self tuning cycle (a), the outputs 1150 of two variable capacitors 115 are respectively connected to the common-mode reference level VCM, the input 110 and output 112 of the Op-amp 114 are short-circuited, and the input 111 and the output 113 of the Op-amp 114 are short-circuited to memorize the inherent DC offset of the Op-amp 114.

In the charge cycle (b), the short circuit of the input 110 and output 112 of the Op-amp 114 and the short circuit of the input 111 and output 113 are disconnected and the outputs 1150 of the two variable capacitors 115 are respectively connected to the output 112 and output 113 of the Op-amp 114. The integrator unit 11 integrates the output of the Gm unit 10 in the cycle.

In the output cycle (c), the input 110 and output 111 of the Op-amp 114 are short-circuited to output the integral voltage.

Figure 11:
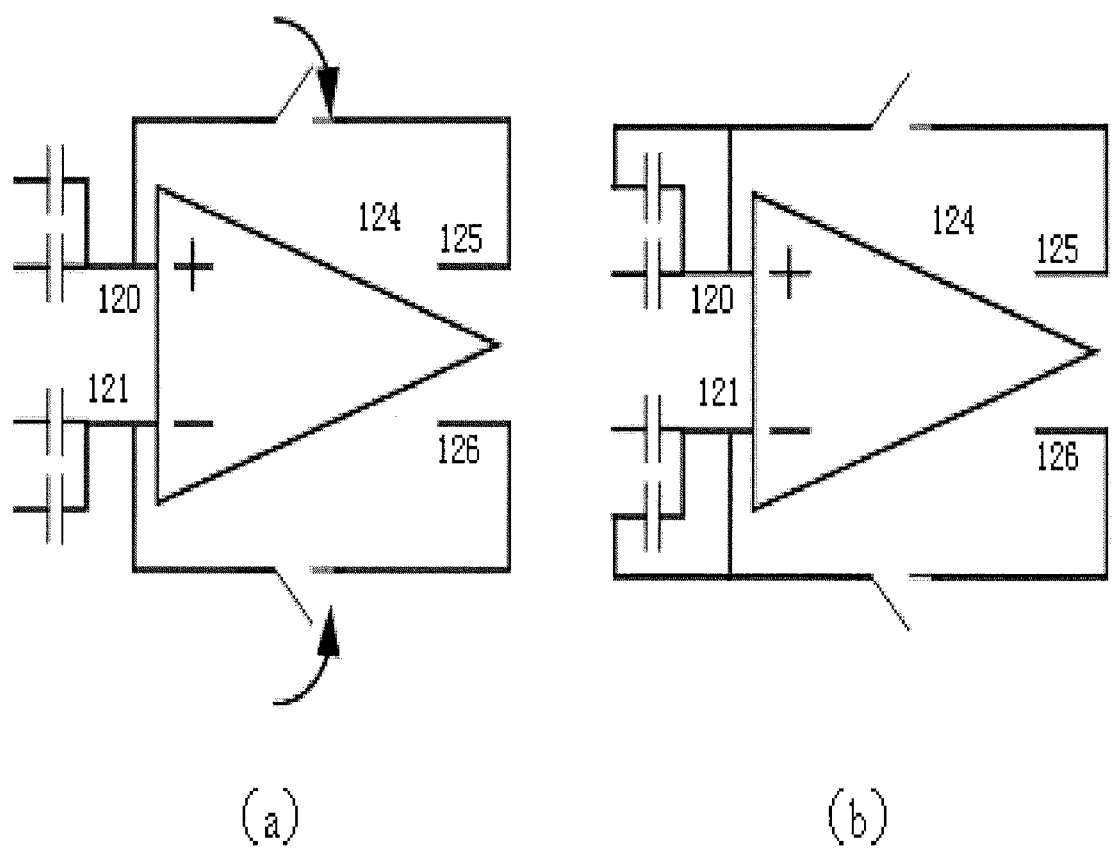
FIG. 11 shows the precise voltage subtraction and amplification by a voltage comparator in a comparator unit provided by an embodiment of the present invention.

With respect to the voltage comparator 124 in the comparator unit 12, an embodiment of the present invention implements precise voltage subtraction and amplification via a two-phase switched capacitor technology, as shown in FIG. 11.

In the self tuning and charging cycle (a), the input 120 and output 125 of the voltage comparator 124 are short-circuited and the input 121 and the output 126 are short-circuited so that the output of the integrator unit 11 and the reference voltage charge the variable capacitors 115 simultaneously.

In cycle (b), the input 120 and output 125 of the voltage comparator 124 are disconnected, the input 121 and output 126 of the voltage comparator 124 are disconnected, and the charged variable capacitors 115 are disconnected and then connected to the common-mode reference level VCM. The output then is the comparison result.

Figure 12:
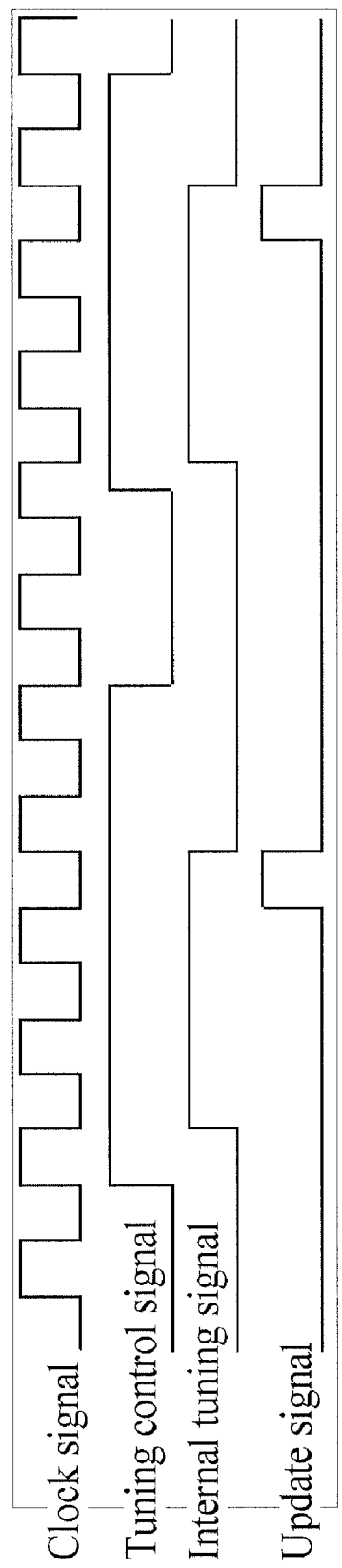
FIG. 12 shows the control sequence of the apparatus for obtaining the tuning capacitance of a Gm-C filter in an embodiment of the present invention.

FIG. 12 shows the control sequence of the apparatus for obtaining the tuning capacitance of a Gm-C filter in an embodiment of the present invention.

The detecting unit 14 of the apparatus for obtaining the tuning capacitance of a Gm-C filter starts tuning and turns on TUN_enable when it detects that the tuning control signal is valid and the internal TUN_enable signal is at a low level. After the tuning is complete, the memory unit 15 updates the stored control code and turns off the TUN_enable signal. This mode supports tuning at any time and functions well to trace the impact of external conditions on the filter frequency.

In the apparatus for obtaining the tuning capacitance of a Gm-C filter in the embodiment of the present invention, a simulated capacitor simulates the capacitor of the Gm-C filter which is set to an even capacitor array in advance. The apparatus also simulates a Gm unit of the Gm-C filter to generate a current and integrates the simulated capacitor to obtain an integral voltage. The apparatus compares the integral voltage with a reference voltage and finds a tuning capacitance that makes the integral voltage equal to the reference voltage in a gradual approaching manner. Such tuning is linear discrete and will not result in the change of the linearity of the Gm-C filter with the tail current. The apparatus also performs positive integration and negative integration on the capacitor array to eliminate the DC offset caused by the Gm unit. Thus, the precision of Gm-C filter tuning is improved without affecting performance of the Gm-C filter.

Figure 13:
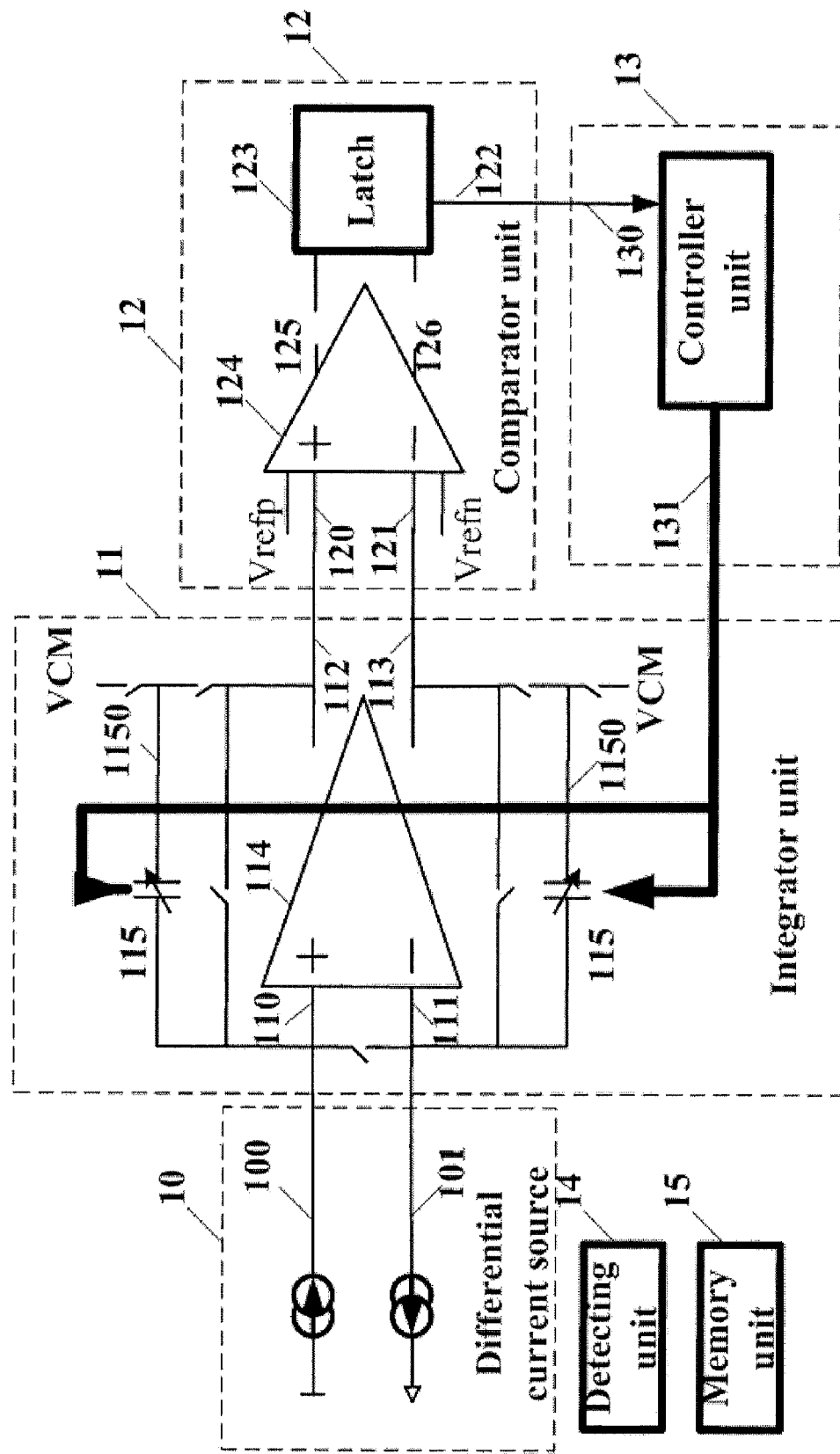
FIG. 13 shows the structure of an apparatus for obtaining the tuning capacitance of a Gm-C filter in a third embodiment of the present invention.

FIG. 13 shows the structure of an apparatus for obtaining the tuning capacitance of a Gm-C filter in a third embodiment of the present invention.

In this embodiment, the Gm unit is properly converted to get a complete active R, C tuning circuit. In particular, the Gm unit is directly changed to a differential current outputting unit (or differential current source). After the change, the structure of the apparatus for obtaining the tuning capacitance of a Gm-C filter is shown in FIG. 11. The apparatus includes a differential current source 10 (reference current source), an integrator unit 11, a comparator unit 12, a controller unit 13, a detecting unit 14, and a memory unit 15. Its connection and internal structure are the same as in the first embodiment and therefore omitted here. The current $$I_0 = \frac{V_{ref}}{R}$$

outputted by the differential current source 10 is in inverse proportion to the resistance R and in direct proportion to the reference voltage $V_{ref}$. According to the control method in the first embodiment of the present invention, the capacitor array is first integrated to obtain the integral voltage $$V_{out} = \frac{I_0}{C_{int}} \times \Delta t.$$

In the formula, $V_{ref}$ is a preset reference voltage, $\Delta t$ is the given time for integration, and $C_{int}$ is the actually used tuning capacitance. The voltage comparator 124 of the comparator unit 12 subtracts and amplifies the $V_{out}$ via a two-phase switched capacitor. The comparator unit 123 of the comparator unit 12 compares $V_{out}$ and $V_{ref}$. Under control of the control code generated by the controller unit 13, the $C_{int}$ that makes $V_{out}$ equal to $V_{ref}$ and the corresponding control code are found by gradual approaching. Such $C_{int}$ is the tuning capacitance and the corresponding control code is provided for the Gm-C filter.

In the apparatus for obtaining the tuning capacitance of a Gm-C filter in the embodiment of the present invention, a simulated capacitor simulates the capacitor of the Gm-C filter which is set to an even capacitor array in advance. The apparatus also simulates a differential current source to generate a current and integrates the capacitor array to obtain an integral voltage. The apparatus compares the integral voltage with the reference voltage and finds a tuning capacitance that makes the integral voltage equal to the reference voltage in a gradual approaching manner. Such tuning is linear discrete and will not result in the change of the linearity of the Gm-C filter with the tail current. The apparatus also performs positive integration and negative integration on the capacitor array to eliminate the DC offset caused by the Gm unit. Thus, the precision of Gm-C filter tuning is improved without affecting performance of the Gm-C filter.

Figure 14:
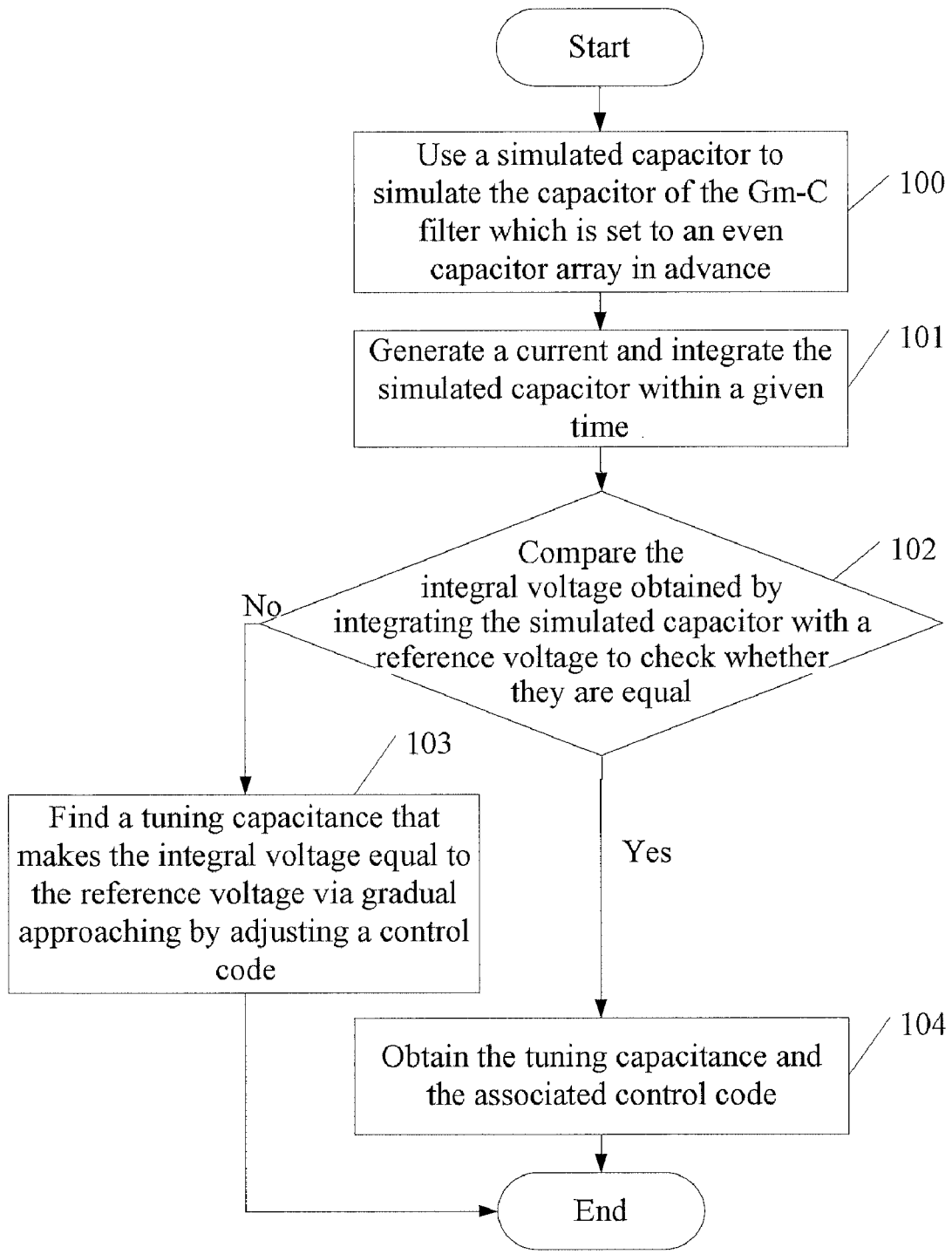
FIG. 14 is a flowchart of a method for obtaining the tuning capacitance of a Gm-C filter in a first embodiment of the present invention.

FIG. 14 is a flowchart of a method for obtaining the tuning capacitance of a Gm-C filter in a first embodiment of the present invention.

The method for obtaining the tuning capacitance of a Gm-C filter in the embodiment of the present invention includes:

Step 100: Use a simulated capacitor to simulate the capacitor of the Gm-C filter which is set to an even capacitor array in advance.

Step 101: Generate a current and integrate the simulated capacitor within a given time.

Step 102: Compare the integral voltage obtained by integrating the simulated capacitor with a reference voltage;

check whether the two voltages are equal; if they are not equal, go to step 103 and if they are equal, go to step 104.

Step 103: Find the tuning capacitance that makes the integral voltage equal to the reference voltage via gradual approaching by adjusting a control code.

Step 104: Obtain the tuning capacitance and the corresponding control code.

Figure 15:
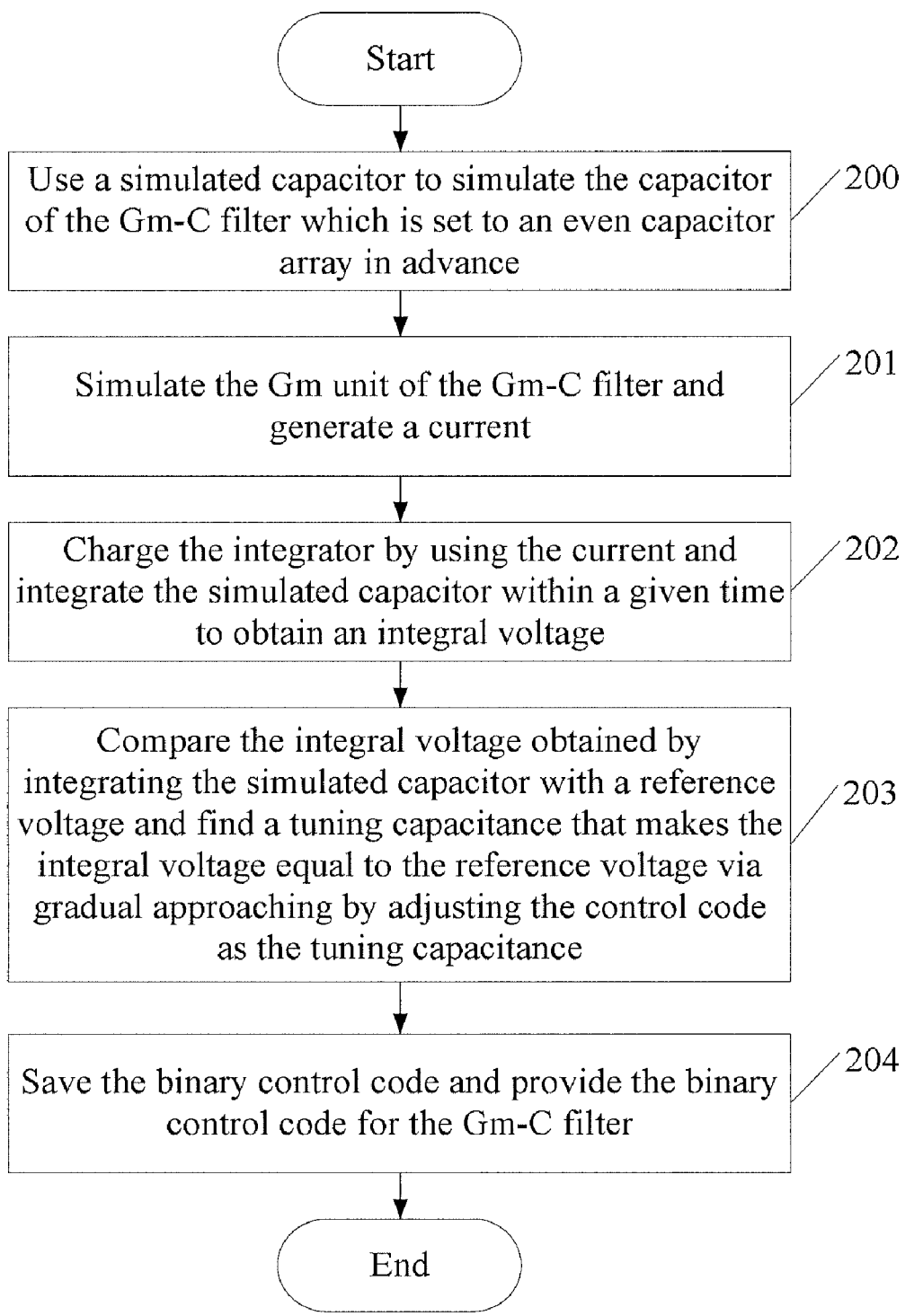
FIG. 15 is a flowchart of a method for obtaining the tuning capacitance of a Gm-C filter in a second embodiment of the present invention.

FIG. 15 is a flowchart of a method for obtaining the tuning capacitance of a Gm-C filter in a second embodiment of the present invention.

Step 200: Use a simulated capacitor to simulate the capacitor of the Gm-C filter which is set to an even capacitor array in advance and includes a fixed part and tuning part. This means that the capacitance of the capacitor array is $C=C_{fix}+C_{tuning}$, where $C_{fix}$ is a fixed number of unit capacitors and $C_{tuning}$ is a configurable number of unit capacitors. The tuning frequency of the Gm-C filter is decided by the ratio of $C_{fix}$ to $C_{tuning}$.

Step 201: Simulate a Gm unit of the Gm-C filter and generate a current.

Step 202: Charge the integrator by using the current and integrate the simulated capacitor within a given time to obtain the integral voltage $$V_{out} = \frac{G_m \times V_{ref} \times \Delta t}{C_{int}},$$

where, $V_{ref}$ is a preset reference voltage, $\Delta t$ is the given time for integration, and $C_{int}$ is the actually used tuning capacitance. The $C_{int}$ is controlled by an N-bit binary code. Its range is ($0$-$2^N$-$1$) configurable unit capacitors $G_{tuning}$, where N is a natural number.

Step 202: Compare the integral voltage $V_{out}$ obtained by integrating the simulated capacitor and the reference voltage $V_{ref}$ and adjust the control code to find the simulated capacitance that makes $V_{out}$ equal to $V_{ref}$ by gradual approaching. The simulated capacitance is regarded as the tuning capacitance. In particular, this step determines whether $G_m/C_{int}$ equals 1 to know whether $V_{out}$ equals $V_{ref}$. When $G_m/C_{int}$ equals 1, the $C_{int}$ is the tuning capacitance and the corresponding binary control code is the binary control code obtained by tuning.

Step 203: Save the binary control code and provide the binary control code for the Gm-C filter.

Figure 16:
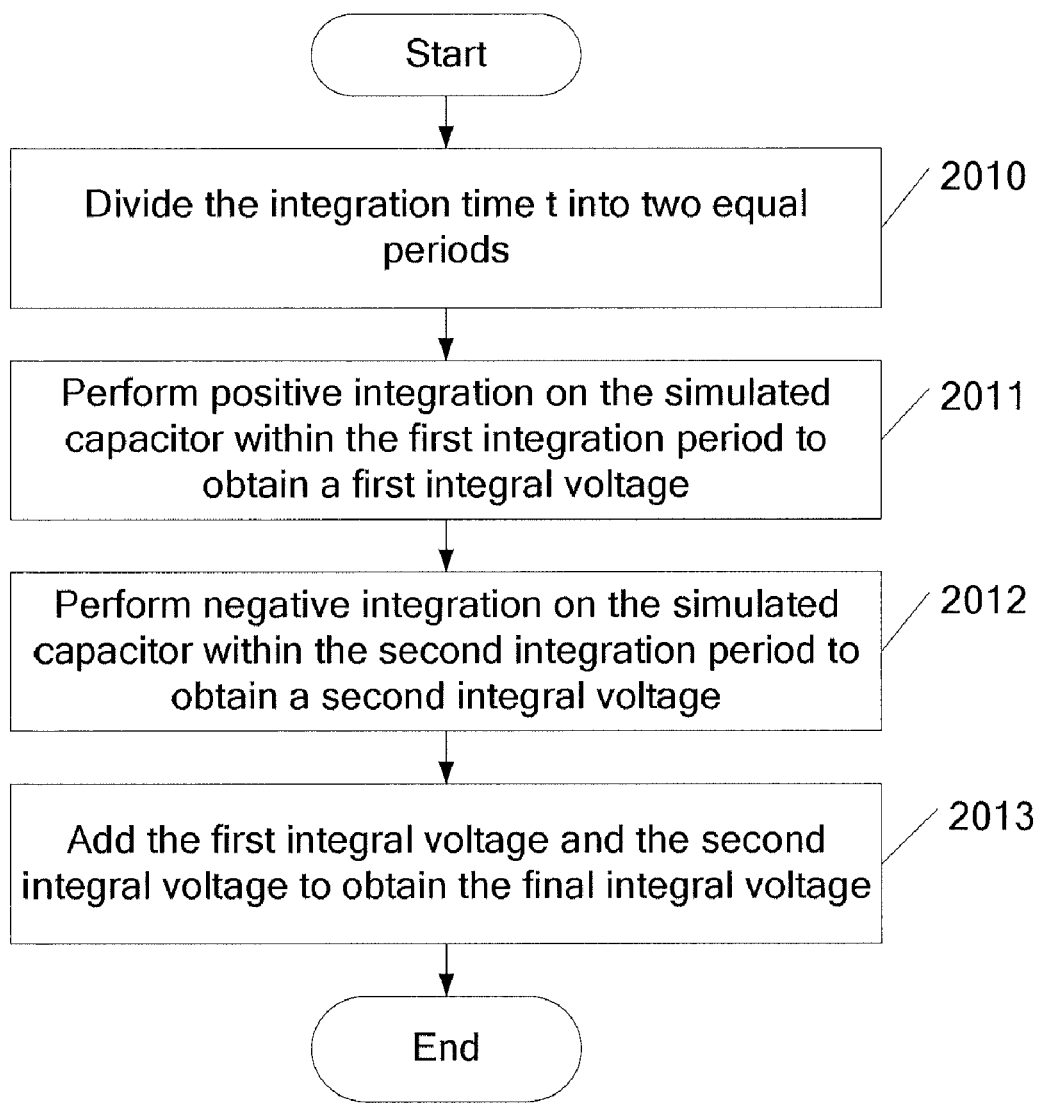
FIG. 16 is a flowchart for integrating a capacity array within a given time to obtain an integral voltage in an embodiment of the present invention.

Particularly, as shown in FIG. 16, the step 201 of charging the integrator by using the current and integrating the simulated capacitor within a given time to obtain the integral voltage includes:

Step 2010: Divide the integration time $\Delta t$ into two equal periods $$\frac{\Delta t}{2}.$$

Step 2011: Perform positive integration on the simulated capacitor within the first $$\frac{\Delta t}{2}$$

to obtain a first integral voltage.

Step 2012: Perform negative integration on the simulated capacitor within the second $$\frac{\Delta t}{2}$$

to obtain a second integral voltage.

Step 2013: Add the first integral voltage and the second integral voltage to obtain the final integral voltage so as to eliminate the DC offset generated by the Gm unit.

Figure 17:
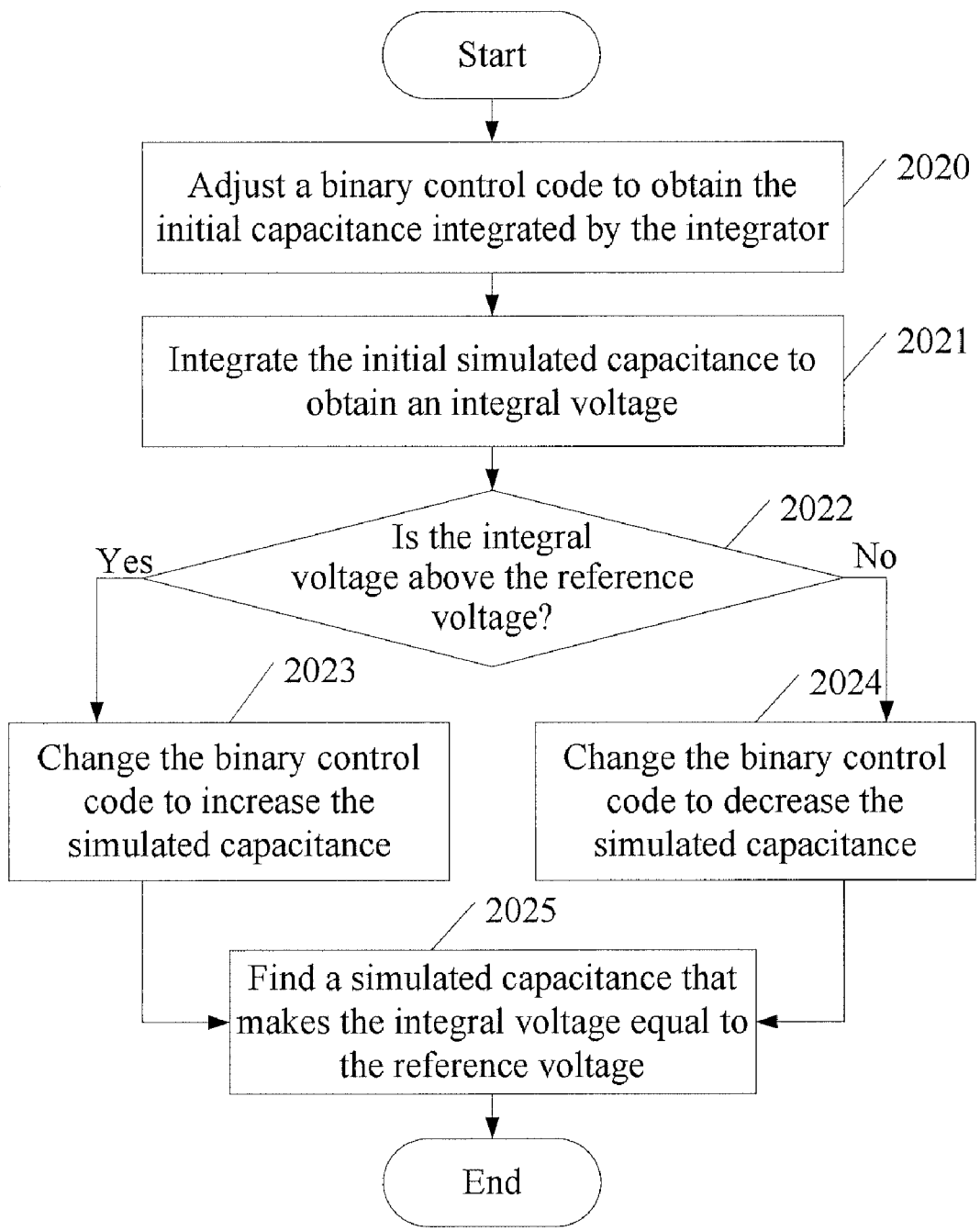
FIG. 17 is a flowchart for finding a tuning capacitance that makes the integral voltage equal to a reference voltage via gradual approaching in an embodiment of the present invention.

FIG. 17 is a flowchart for finding the tuning capacitance that makes the integral voltage equal to the reference voltage by gradual approaching.

The step 202 of comparing the integral voltage obtained by integrating the simulated capacitor with the reference voltage and finding the tuning capacitance that makes $V_{out}$ equal to Vref via gradual approaching by adjusting the control code includes:

Step 2020: Adjust the binary control code so that the initial simulated capacitance of the simulated capacitor integrated by the integrator is $$C = C_{fix} + \frac{2^{N-1}}{2^N - 1} C_{tuning}.$$

Step 2021: Integrate the initial capacitance $$C = C_{fix} + \frac{2^{N-1}}{2^N - 1} C_{tuning}$$

by using the formula $$V_{out} = \frac{G_m \times V_{ref} \times \Delta t}{C_{int}}$$

to obtain the integral voltage $V_{out}$.

Step 2022: Judge whether $V_{out}$ is above the reference voltage $V_{ref}$. If so, go to step 2023 or else go to step 2024.

Step 2023: Change the binary control code if the integral voltage $V_{out}$ is above the reference voltage $V_{ref}$ so that the simulated capacitance is $$C = C_{fix} + \frac{2^{N-1} + 2^{N-2}}{2^N - 1} C_{tuning}.$$

Step 2024: Change the binary control code if the integral voltage $V_{out}$ is below the reference voltage $V_{ref}$ so that the simulated capacitance is $$C = C_{fix} + \frac{2^{N-1} + 2^{N-2}}{2^N - 1} C_{tuning}.$$

Repeat the above step to find the simulated capacitance $C_{int}$ that makes the integral voltage $V_{out}$ equal to the reference voltage $V_{ref}$ via gradual approaching by changing the binary control code.

Step 2025: Find the simulated capacitance $C_{int}$ that makes the integral voltage $V_{out}$ equal to the reference voltage $V_{ref}$. The simulated capacitance $C_{int}$ is the tuning capacitance. The binary control code corresponding to the tuning capacitance is provided for the Gm-C filter.

In the method for obtaining the tuning capacitance of a Gm-C filter in the embodiment of the present invention, a simulated capacitor simulates the capacitor of the Gm-C filter which is set to an even capacitor array in advance. A Gm unit is simulated to generate a current. The simulated capacitor is integrated to obtain an integral voltage. The integral voltage is compared with a reference voltage and a tuning capacitance that makes the integral voltage equal to the reference voltage is found in a gradual approaching manner. Such tuning is linear discrete and will not result in the change of the linearity of the Gm-C filter with the tail current. Positive integration and negative integration are also performed on the capacitor array to eliminate the DC offset caused by the Gm unit. Thus, the precision of Gm-C filter tuning is improved without affecting performance of the Gm-C filter.

Figure 18:
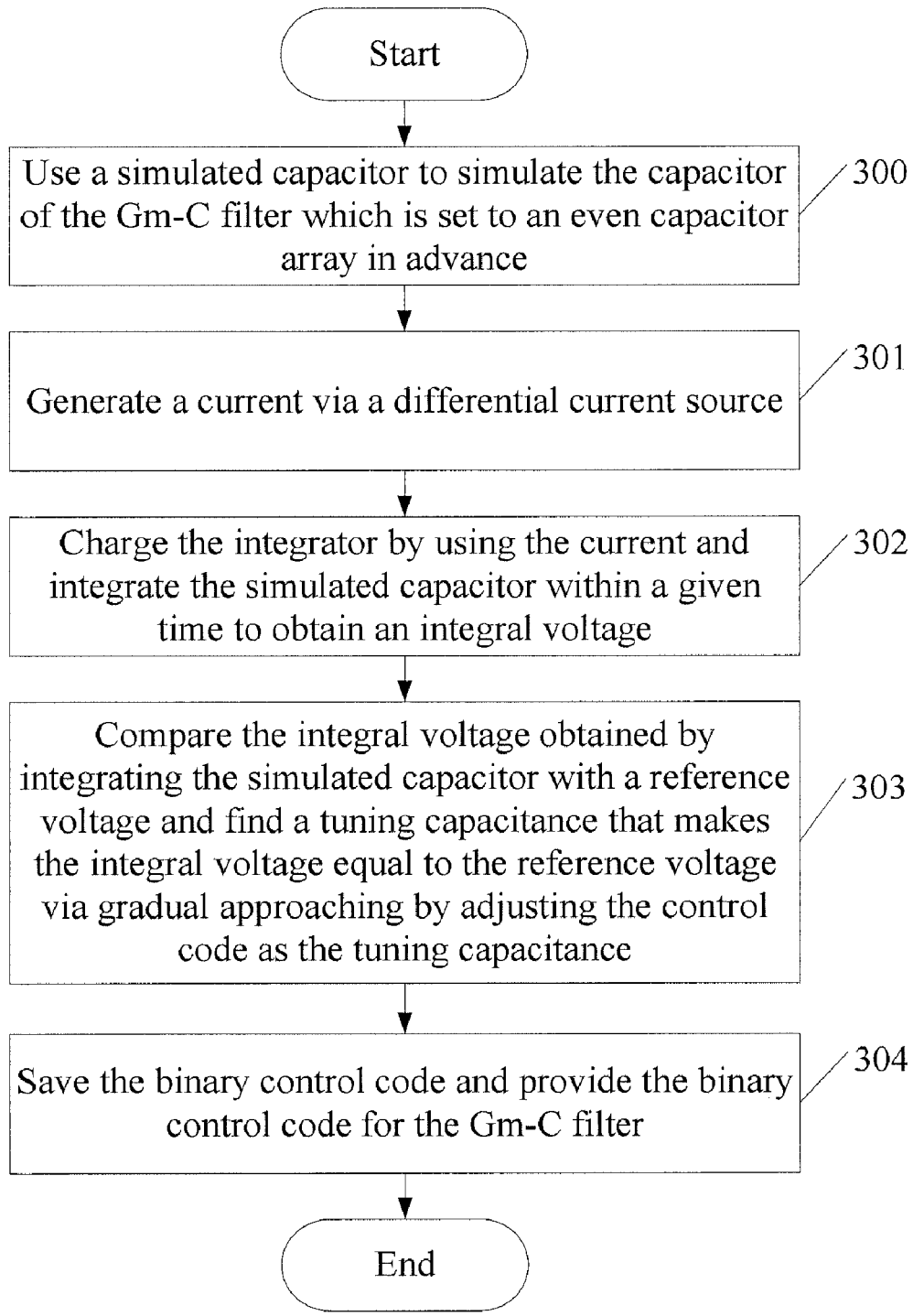
FIG. 18 is a flowchart of a method for obtaining the tuning capacitance of a Gm-C filter in a third embodiment of the present invention.

FIG. 18 is a flowchart of a method for obtaining the tuning capacitance of a Gm-C filter in a third embodiment of the present invention.

Step 300: Use a capacitor to simulate the capacitor of the filter which is set to an even capacitor array in advance and includes a fixed part and a tuning part. This means the capacitance of the capacitor array is $C=C_{fix}+C_{tuning}$, where $C_{fix}$ is a fixed number of unit capacitors and $C_{tuning}$ is a configurable number of unit capacitors. The tuning frequency of the Gm-C filter is decided by the ratio of $C_{fix}$ to $C_{fix}$.

Step 301: Use a differential current source to generate a current.

Step 202: Charge the integrator by using the current and integrate the simulated capacitor within a given time to obtain the integral voltage $$V_{out} = \frac{I_0}{C_{int}} \times \Delta t,$$

where, $$I_0 = \frac{V_{ref}}{R},$$

$I_0$ is the intensity of the current generated by the differential current source, $V_{ref}$ is a preset reference voltage, $\Delta t$ is a given time for integration, and $C_{int}$ is the simulated capacitance actually used in the tuning process. The $C_{int}$ is controlled by an N-bit binary code. Its range is $(0-2^N-1)$ configurable unit capacitors $C_{tuning}$, where N is a natural number.

Step 302: Compare the integral voltage $V_{out}$ obtained by integrating the simulated capacitor and the reference voltage $V_{ref}$ and adjust the control code to find the simulated capacitance that makes $V_{out}$ equal to $V_{ref}$ by gradual approaching. The simulated capacitance is regarded as the tuning capacitance. In particular, this step determines whether $1/C_{int}$ equals 1 to know whether $V_{out}$ equals $V_{ref}$. When $1/C_{int}$ equals or is above 1, the tuning is over. The $C_{int}$ then is the tuning capacitance and the corresponding binary control code is the binary control code obtained by tuning.

Step 303: Save the binary control code and provide the binary control code for the Gm-C filter.

In the method for obtaining the tuning capacitance of a Gm-C filter in the embodiment of the present invention, a capacitor simulates the capacitor of the Gm-C filter which is set to an even capacitor array in advance; a differential current source generates a current; the simulated capacitor is integrated to obtain an integral voltage. The integral voltage is compared with a reference voltage and a tuning capacitance that makes the integral voltage equal to the reference voltage is found in a gradual approaching manner. Such tuning is linear discrete and will not result in the change of the linearity of the Gm-C filter with the tail current. Positive integration and negative integration are also performed on the capacitor array to eliminate the DC offset caused by the Gm unit. Thus, the precision of Gm-C filter tuning is improved without affecting performance of the Gm-C filter.

Through the descriptions of the preceding embodiments, those skilled in the art may understand that the present invention may be implemented by hardware only or by software and a necessary universal hardware platform. Based on such understandings, the technical solution under the present invention may be embodied in the form of a software product. The software product may be stored in a nonvolatile storage medium, which can be a Compact Disk Read-Only Memory unit (CD-ROM), a USB flash disk, or a removable hard disk. The software product includes a number of instructions that enable a computer device (personal computer, server, or network device) to execute the methods provided in the embodiments of the present invention.

In conclusion, the above are merely preferred embodiments of the present invention. However, the scope of the present invention is not limited thereto. Changes or replacements readily apparent to persons skilled in the prior art within the technical scope of the present invention should fall within the scope of the present invention. Therefore, the scope of protection of the present invention is subject to the appended claims.

What is claimed is:

1. A method for obtaining a tuning capacitance of a Gm-C filter, comprising:
   generating a current for charging an integrator of the Gm-C filter;
   integrating a simulated capacitor of the Gm-C filter within a given time when the integrator is charged, wherein the simulated capacitor simulates a capacitor of the Gm-C filter which is set to a capacitor array; and
   comparing an integral voltage obtained by integrating the simulated capacitor with a preset reference voltage, finding a simulated capacitance of the simulated capacitor that makes the integral voltage equal to the reference voltage via gradual approaching by adjusting a control code, and determining the simulated capacitance as the tuning capacitance.

2. The method of claim 1, further comprising:
   simulating a Gm unit of the Gm-C filter and generating the current,
   wherein the step of integrating the simulated capacitor further comprises: integrating the simulated capacitor by using a formula $$V_{out} = \frac{G_m \times V_{ref} \times \Delta t}{C_{int}}$$

to obtain the integral voltage; wherein, $V_{out}$ is the integral voltage, $G_m$ is a Gm value of the Gm-C filter, $V_{ref}$ is the preset reference voltage, Δt is the given time for integration, and $C_{int}$ is an actual simulated capacitance used by a tuning process.

3. The method of claim 2, further comprising:
dividing the given time Δt into two equal periods $$\frac{\Delta t}{2};$$

performing positive integration on the simulated capacitor within the first $$\frac{\Delta t}{2}$$

to obtain a first integral voltage;
performing negative integration on the simulated capacitor within the second $$\frac{\Delta t}{2}$$

to obtain a second integral voltage; and
adding the first integral voltage and the second integral voltage to obtain a final integral voltage to eliminate a DC offset caused by the Gm unit or the differential current source.

4. The method of claim 2, further comprising:
eliminating a DC offset generated by the integrator with an automatic zero-set technology.

5. The method of claim 2, further comprising:
setting the capacitor array of the Gm-C filter to a combination of a fixed capacitor part and a tuning capacitor part, so that the capacitor array $C=C_{fix}+C_{tuning}$, where $C_{fix}$ is a fixed number of unit capacitors, $C_{tuning}$ is a configurable number of unit capacitors, and the tuning frequency range of the capacitor of the Gm-C filter is decided by a ratio of $C_{fix}$ to $C_{tuning}$.

6. The method of claim 5, wherein the tuning capacitor is controlled by an N-bit binary control code, the tuning range is between 0 and $(2^N-1)$ corresponding to the number of the unit capacitors $C_{tuning}$, wherein N is a natural number.

7. The method of claim 6, wherein the step of comparing the integral voltage obtained from the integrator with the preset reference voltage, finding the simulated capacitance that makes the integral voltage equal to the reference voltage via gradual approaching by adjusting the control code, and determining the simulated capacitance as the tuning capacitance comprises:
adjusting the binary control code so that the initial simulated capacitance integrated by the integrator is $$C = C_{fix} + \frac{2^{N-1}}{2^N - 1} C_{tuning};$$

integrating the initial simulated capacitance $$C = C_{fix} + \frac{2^{N-1}}{2^N - 1} C_{tuning}$$

to obtain the integral voltage;

if the integral voltage is above the reference voltage, changing the binary control code so that the simulated capacitance is $$C = C_{fix} + \frac{2^{N-1} + 2^{N-2}}{2^N - 1} C_{tuning};$$

if the integral voltage is below the reference voltage, changing the binary control code so that the simulated capacitance is $$C = C_{fix} + \frac{2^{N-1} + 2^{N-2}}{2^N - 1} C_{tuning};$$

and
repeating the above step to find the simulated capacitance that makes the integral voltage equal to the reference voltage via gradual approaching by changing the binary control code, and determining the simulated capacitance as the tuning capacitance.

8. The method of claim 1, further comprising:
generating a current via a differential current source,
wherein the step of integrating the simulated capacitor further comprises: integrating the simulated capacitor by using a formula $$V_{out} = \frac{I_0}{C_{int}} \times \Delta t$$

to obtain the integral voltage;
wherein, $V_{out}$ is the integral voltage, $$I_0 = \frac{V_{ref}}{R},$$

$I_o$ is intensity of the current generated by the differential current source, $V_{ref}$ is the preset reference voltage, Δt is the given time for integration, and $C_{int}$ is an actual simulated capacitance used by a tuning process.

9. The method of claim 8, further comprising:
dividing the given time Δt into two equal periods $$\frac{\Delta t}{2};$$

performing positive integration on the simulated capacitor within the first $$\frac{\Delta t}{2}$$

to obtain a first integral voltage;

performing negative integration on the simulated capacitor within the second $$\frac{\Delta t}{2}$$

to obtain a second integral voltage; and adding the first integral voltage and the second integral voltage to obtain a final integral voltage to eliminate a DC offset caused by the differential current source.

10. The method of claim 8, further comprising:
eliminating a DC offset generated by the integrator with an automatic zero-set technology.

11. The method of claim 8, further comprising:
setting the capacitor array of the Gm-C filter to a combination of a fixed capacitor part and a tuning capacitor part, so that the capacitor array $C=C_{fix}+C_{tuning}$, where $C_{fix}$ is a fixed number of unit capacitors, $C_{tuning}$ is a configurable number of unit capacitors, and the tuning frequency range of the capacitor of the Gm-C filter is decided by a ratio of $C_{fix}$ to $C_{tuning}$.

12. The method of claim 11, wherein the tuning capacitor is controlled by an N-bit binary control code, the tuning range is between 0 and $(2^N-1)$ corresponding to the number of the unit capacitors $C_{tuning}$, wherein N is a natural number.

13. The method of claim 12, wherein the step of comparing the integral voltage obtained from the integrator with the preset reference voltage, finding the simulated capacitance that makes the integral voltage equal to the reference voltage via gradual approaching by adjusting the control code, and determining the simulated capacitance as the tuning capacitance comprises:

adjusting the binary control code so that the initial simulated capacitance integrated by the integrator is $$C = C_{fix} + \frac{2^{N-1}}{2^N - 1} C_{tuning};$$

integrating the initial simulated capacitance $$C = C_{fix} + \frac{2^{N-1}}{2^N - 1} C_{tuning}$$

to obtain the integral voltage;

if the integral voltage is above the reference voltage, changing the binary control code so that the simulated capacitance is $$C = C_{fix} + \frac{2^{N-1} + 2^{N-2}}{2^N - 1} C_{tuning};$$

if the integral voltage is below the reference voltage, changing the binary control code so that the simulated capacitance is $$C = C_{fix} + \frac{2^{N-1} - 2^{N-2}}{2^N - 1} C_{tuning};$$

and repeating the above step to find the simulated capacitance that makes the integral voltage equal to the reference voltage via gradual approaching by changing the binary control code, and determining the simulated capacitance as the tuning capacitance.

14. An apparatus for obtaining a tuning capacitance of a Gm-C filter, comprising:
a current supply unit, adapted to generate a current to charge an integrator unit;
the integrator unit, adapted to integrate a simulated capacitor within a given time when it is charged, wherein the simulated capacitor simulates a capacitor of the Gm-C filter which is set to a capacitor array;
a comparator unit, adapted to compare an integral voltage obtained by integrating the simulated capacitor with a preset reference voltage; and
a controller unit, adapted to find a simulated capacitance of the simulated capacitor that makes the integral voltage equal to the reference voltage via gradual approaching by adjusting a control code and determining the simulated capacitance as the tuning capacitance.

15. The apparatus of claim 14, wherein:
the current supply unit is a Gm unit, adapted to simulate the structure of a Gm unit in the Gm-C filter,
the integrator unit comprises:
a time dividing subunit, adapted to divide the integration time Δt into two equal periods of $$\frac{\Delta t}{2};$$

a first integrating subunit, adapted to perform positive integration on the simulated capacitor within a first $$\frac{\Delta t}{2}$$

to obtain a first integral voltage;
a second integrating subunit, adapted to perform negative integration on the simulated capacitor within a second $$\frac{\Delta t}{2}$$

to obtain a second integral voltage; and
an integral voltage adding unit, adapted to add the first integral voltage and the second integral voltage to obtain a final integral voltage to eliminate a DC offset caused by the Gm unit.

16. The apparatus of claim 14, wherein the controller unit comprises:
a control code outputting subunit, adapted to output an N-bit binary control code to the integrator unit, where N is a natural number; and
a control code adjusting subunit, adapted to change the binary control code gradually to find a simulated capacitance that makes the integral voltage equal to the reference voltage as the tuning capacitance.

17. The apparatus of claim 14, wherein:
the current supply unit is a differential current source,
the integrator unit comprises:
a time dividing subunit, adapted to divide the integration time Δt into two equal periods of $$\frac{\Delta t}{2};$$

a first integrating subunit, adapted to perform positive integration on the simulated capacitor within a first $$\frac{\Delta t}{2}$$

to obtain a first integral voltage;

a second integrating subunit, adapted to perform negative integration on the simulated capacitor within a second $$\frac{\Delta t}{2}$$

to obtain a second integral voltage; and an integral voltage adding unit, adapted to add the first integral voltage and the second integral voltage to obtain a final integral voltage to eliminate a DC offset caused by the differential current source.

18. The apparatus of claim 14, wherein the controller unit comprises:

a control code outputting subunit, adapted to output an N-bit binary control code to the integrator unit, where N is a natural number; and a control code adjusting subunit, adapted to change the binary control code gradually to find a simulated capacitance that makes the integral voltage equal to the reference voltage as the tuning capacitance.

19. The apparatus of claim 18, further comprising:

a detecting unit, adapted to start a tuning process when detecting a valid tuning control signal to obtain a tuning capacitance; and a memory unit, adapted to store a control code associated with the tuning capacitance at the end of the tuning and provide the control code for the Gm-C filter to tune the capacitance of the Gm-C filter.

20. A Gm-C filter tuning system, comprising:

an apparatus for obtaining a tuning capacitance of a Gm-C filter, adapted to integrate a simulated capacitor which simulates a capacitor of the Gm-C filter that is set to a capacitor array to obtain an integral voltage, find a simulated capacitance that makes the integral voltage equal to a preset reference voltage via gradual approaching by adjusting control codes, determine the simulated capacitance as the tuning capacitance, store a control code associated with the tuning capacitance, and provide the control code for the Gm-C filter to tune the capacitance of the Gm-C filter; and the Gm-C filter, adapted to tune the tuning capacitance associated with the control code provided by the apparatus.

* * * * *

UNITED STATES PATENT AND TRADEMARK OFFICE
CERTIFICATE OF CORRECTION

PATENT NO.       : 8,013,670 B2
APPLICATION NO.  : 12/882734
DATED            : September 6, 2011
INVENTOR(S)      : Xiaosheng Zhu It is certified that error appears in the above-identified patent and that said Letters Patent is hereby corrected as shown below:

Col. 16, in Claim 7, between lines 15 and 19, please replace:

$$C = C_{fix} + \frac{2^{N-1} + 2^{N-2}}{2^N - 1} C_{tuning}$$

with:

$$C = C_{fix} + \frac{2^{N-1} - 2^{N-2}}{2^N - 1} C_{tuning}$$

Signed and Sealed this
Fourteenth Day of February, 2012

David J. Kappos
*Director of the United States Patent and Trademark Office*